United States Patent
Richter

(10) Patent No.: US 9,312,452 B2
(45) Date of Patent: Apr. 12, 2016

(54) METHOD FOR PRODUCING A CONVERSION LAMINA AND CONVERSION LAMINA

(75) Inventor: Markus Richter, Burglengenfeld (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 87 days.

(21) Appl. No.: 13/878,211

(22) PCT Filed: Sep. 28, 2011

(86) PCT No.: PCT/EP2011/066905
§ 371 (c)(1),
(2), (4) Date: Jun. 21, 2013

(87) PCT Pub. No.: WO2012/052271
PCT Pub. Date: Apr. 26, 2012

(65) Prior Publication Data
US 2013/0285100 A1    Oct. 31, 2013

(30) Foreign Application Priority Data
Oct. 22, 2010  (DE) .......................... 10 2010 049 312

(51) Int. Cl.
*H01L 21/00* (2006.01)
*H01L 33/44* (2010.01)
(Continued)

(52) U.S. Cl.
CPC ............ *H01L 33/44* (2013.01); *H01L 21/4867* (2013.01); *H01L 21/56* (2013.01); *H01L 33/48* (2013.01); *H01L 33/50* (2013.01); *H01L 51/004* (2013.01)

(58) Field of Classification Search
CPC ..... H01L 21/56; H01L 21/4867; H01L 51/004; H01L 33/44; H01L 33/48; H01L 33/50
USPC ....................................... 438/26–32
See application file for complete search history.

(56) References Cited

U.S. PATENT DOCUMENTS 7,049,159 B2 * 5/2006 Lowery ............................ 438/22
7,397,177 B2   7/2008 Takahashi et al.
(Continued)

FOREIGN PATENT DOCUMENTS

CN          1661819 A      8/2005
DE    10 2009 040 148 A1   3/2011
(Continued)

OTHER PUBLICATIONS

Moore-Watts, K., "Press Centre; DEK launches new VectorGuard® Double Layer Platinum stencil," DEK International, Press Release, downloaded from http://www.dek.com/comms.nsf, Jan. 2011, 4 pages.

(Continued)

*Primary Examiner* — Matthew E Warren
(74) *Attorney, Agent, or Firm* — Slater & Matsil, L.L.P.

(57) ABSTRACT

A method for producing at least one conversion lamina for a radiation-emitting semiconductor component is specified. A base material including a conversion substance contained therein is applied to a substrate by means of a double-layered stencil. Furthermore, a conversion lamina for a radiation-emitting semiconductor component includes a base material and a conversion substance embedded therein. The thickness of the conversion lamina is in a range of between 60 μm and 170 μm inclusive.

13 Claims, 3 Drawing Sheets

(51) Int. Cl.
*H01L 33/48* (2010.01)
*H01L 21/48* (2006.01)
*H01L 21/56* (2006.01)
*H01L 33/50* (2010.01)
*H01L 51/00* (2006.01)

(56) References Cited

U.S. PATENT DOCUMENTS

| | | |
|---|---|---|
| 2004/0191956 A1 | 9/2004 | Shimoaka |
| 2005/0146879 A1 | 7/2005 | Takahashi et al. |
| 2006/0170332 A1 | 8/2006 | Tamaki et al. |
| 2008/0230118 A1* | 9/2008 | Nakatani et al. ............ 136/255 |
| 2009/0081823 A1* | 3/2009 | Meeus et al. .................. 438/98 |
| 2009/0278151 A1 | 11/2009 | Kim |

FOREIGN PATENT DOCUMENTS

| | | |
|---|---|---|
| DE | 10 2010 022 561 A1 | 12/2011 |
| DE | 10 2010 034 923 A1 | 2/2012 |
| EP | 1 198 016 A2 | 4/2002 |
| EP | 1198016 A2 | 4/2002 |
| EP | 1 681 728 A1 | 7/2006 |
| JP | 2001277745 A * | 10/2001 |
| JP | 2002141559 A1 | 5/2002 |
| JP | 2005123588 A | 5/2005 |
| JP | 2010023254 A | 2/2010 |
| JP | 2010228320 A | 10/2010 |
| KR | 100951096 B1 | 4/2010 |
| WO | WO 2006/121196 A1 | 11/2006 |

OTHER PUBLICATIONS

DEK, "Stencils & Screens," DEK International, Press Release, downloaded from http://www.dek.com/web.nsf/desearch/stencils_vectorguard_double_platinum, Aug. 25, 2010, 3 pages.

* cited by examiner

METHOD FOR PRODUCING A CONVERSION LAMINA AND CONVERSION LAMINA

This patent application is a national phase filing under section 371 of PCT/EP2011/066905, filed Sep. 28, 2011, which claims the priority of German patent application 10 2010 049 312.0, filed Oct. 22, 2010, each of which is incorporated herein by reference in its entirety.

TECHNICAL FIELD

The invention relates to a method for producing a conversion lamina for a radiation-emitting semiconductor component. The invention furthermore relates to a conversion lamina for a radiation-emitting semiconductor component.

BACKGROUND

Conventionally, conversion laminae are produced inter alia by means of a screen printing method. In this case, the layer thickness of the conversion laminae is controlled by selecting screens with masks of differing thickness. However, the layer thicknesses of conversion laminae produced in this way are limited to about 40 μm in the screen printing method. In the case of conversion laminae which are produced by means of a screen printing method, the contour of the laminae and the reproducibility of their dimensions and shapes can in addition disadvantageously vary.

SUMMARY OF THE INVENTION

In one aspect, the invention provides a method for producing a conversion lamina having a high layer thickness and simultaneously improved reproducibility as well as improved edge accuracy. In a further aspect, the invention provides a conversion lamina which is distinguished by a high layer thickness.

The invention provides a method for producing at least one conversion lamina for a radiation-emitting semiconductor component, wherein a base material comprising a conversion substance contained therein is applied onto a substrate by means of a double-layer template.

The conversion lamina is thus not produced by a screen printing method, as is usual, but is applied by means of a double-layer template. Owing to its variable thickness, the double-layer template is in this case suitable for producing particularly thick conversion laminae. Conversely, owing to their small thickness of at most 40 μm, conventionally used screens are limited thereto, so that high layer thicknesses of the conversion laminae cannot be achieved by conventional production methods.

In addition, the shape of the conversion lamina can advantageously be influenced by corresponding optimization of the design of the template, for example, aperture, shape and size.

Furthermore, by means of the double-layer template, the contour of the laminae and the reproducibility of their dimensions can be improved by the production method.

The increased layer thickness of the conversion laminae produced in this way is distinguished by a large conversion substance volume. It is therefore possible, inter alia, to operate color loci (also referred to as chromaticity coordinate) which cannot be produced by conventional technology. Furthermore, the increased lamina thickness makes it possible to use conversion substances which are specially optimized in terms of their properties, for example, efficiency, temperature or long-term stability.

The color locus is intended in particular to mean the numerical values which describe color of the radiation emitted by the component in the CIE color space.

The conversion substance is, in particular, suitable for converting radiation of one wavelength into radiation of another wavelength. Conversion laminae comprising such conversion substances are employed for example for radiation-emitting semiconductor components, in which case the conversion laminae are arranged after a radiation exit side of the semiconductor component and are adapted to convert at least a part of the radiation emitted by the semiconductor components into radiation of another wavelength.

In a refinement, the double-layer template is produced by a two-stage lithographic and nickel electrolysis method. A two-layer structure of the template is therefore formed, the two structures of the template advantageously consisting of the same material. The second layer in this case determines, for example, the thickness and configuration, or shape, of the structures to be printed, i.e., the conversion laminae. The two-layer template is in particular especially suitable for applications in which high accuracy is important, and it advantageously offers a long lifetime. Furthermore, it makes it possible to print fine lines and structures of different size.

In a refinement, the template contains nickel. The template preferably consists of only one material, for example, nickel. The base material for the conversion lamina can therefore advantageously be optimally adapted to desired requirements. Owing to the possibility of using an optimized base material, inter alia, it is also possible to achieve better printability, so that the reproducibility and the contour of the laminae can be improved.

In a refinement, the base material comprising conversion substance contained therein is applied by means of a printing method.

In this case, the base material comprising conversion substance contained therein is pressed through the template so that the base material essentially adopts the structure of the template. By corresponding optimization of the design of the structure of the template, for example, shape and size, the shape of the conversion lamina can thus be influenced, and in particular determined.

In a refinement, the template comprises at least one opening, through which the base material comprising conversion substance contained therein is pressed onto the substrate. The shape of the opening in this case determines the shape of the conversion lamina to be produced.

In a refinement, the template comprises a printing side and a bearing side. The bearing side in this case faces toward the substrate, while the printing side faces away from the substrate.

In a refinement, the printing side comprises a nickel fabric structure. Planarity of the printed lamina can advantageously be ensured by the nickel fabric structure. Thus, plane structures of the conversion lamina can advantageously be produced. The nickel fabric structure may furthermore be optimized with a view to the structures to be printed, so that the template can advantageously contribute to improvements of the edge accuracy and the reproducibility of the lamina dimensions.

In a refinement, the base material comprising conversion substance contained therein is applied onto the printing side and subsequently pressed onto the substrate through the template by means of a squeegee. The base material is therefore applied on the side of the template facing away from the substrate and pressed through the opening or openings of the template by means of pressure, so that the base material is arranged in the opening or openings of the template after the printing process. The printing side is preferably for the most part free of base material after the printing process.

In a refinement, the shape of the opening on the bearing side determines the shape of the conversion lamina. In this case, the opening may have different extents and shapes in the vertical direction, i.e., perpendicularly in the direction of the substrate. The shape of the conversion lamina is in this case determined by the shape of the opening on the bearing side.

In a refinement, the opening comprises a grid structure on the printing side. The grid structure advantageously increases the stability of the template. The opening therefore has two regions in this case, which are arranged vertically above one another, the region facing toward the substrate replicating the shape of the conversion lamina to be produced and the region facing away from the substrate having a grid structure for stabilization of the template. Despite this two-layer structure, the template preferably consists of just one material, preferably nickel.

In a refinement, the template is arranged in direct contact with the substrate when the base material is being applied. There is therefore no distance between the template and the substrate during the printing process. The base material is in this case pressed into the openings as far as the substrate during the printing process, so that the base material preferably fully fills the openings after the printing process. After the printing process, the height of the openings thus corresponds approximately to the height of the base material arranged therein.

After the printing process, the template is separated from the substrate in such a way that only the base material comprising conversion substance contained therein remains on the substrate.

In a refinement, the conversion lamina is produced with a thickness of between 60 μm inclusive and 170 μm inclusive. Such thicknesses, for example, cannot be achieved with conventionally used screen printing methods. Owing to the increased layer thickness, a large conversion substance volume for the light conversion can advantageously be made possible. This advantageously increases the possibility of operating a wide spectrum of color loci.

The increased lamina thickness can also make it possible to use conversion substances whose required amount would conventionally exceed the limits of the solid loading in the lamina in the case of thinner conversion laminae. These further conversion substances may have specially adapted properties in terms of their efficiency, thermal stability and long-term stability.

In a refinement, a multiplicity of conversion laminae are produced in a combined method, these being applied onto the substrate in a combined method step by means of a printing method. To this end, the template preferably comprises a multiplicity of openings, by which the shape of a conversion lamina is respectively determined.

The base material is in this case arranged on the printing side of the template over all the openings during the production method and subsequently pressed by a squeegee through all the openings, so that the openings are preferably fully filled with the base material. Subsequently, the template is removed from the substrate, a multiplicity of conversion laminae thus being produced on the substrate, which correspond in their arrangement to the structure of the template.

The template has, for example, a thickness of between 80 μm and 150 μm. The template preferably has a thickness of between 100 μm and 110 μm. A frame, which clamps the template, may be arranged on the side of the template facing away from the substrate.

The substrate is preferably a film substrate which is arranged on a chuck, i.e., a clamping device.

The substrate and the conversion lamina produced are preferably free from a radiation-emitting semiconductor component. In other words, the conversion lamina is not applied directly on a semiconductor component or produced directly thereon. The conversion lamina is adapted to be applied on a semiconductor component, for example, adhesively bonded, only after production has been completed.

A conversion lamina, which is produced by means of the method described above, is suitable in particular for a radiation-emitting semiconductor component. The conversion lamina comprises a base material and a conversion substance embedded therein, the thickness of the conversion lamina lying in a range of between 60 μm inclusive and 170 μm inclusive. Preferably, the layer thickness of the lamina lies between 90 μm and 110 μm.

Preferably, the template comprises a nickel fabric structure on the printing side. By virtue of the template comprising a nickel fabric structure used in the production method, the surface of the lamina can have a mesh structure.

Conversion laminae, which are produced by the method described above, are distinguished in particular by reproducibility of the dimensions and an improvement of the edge accuracy, so that deviations between the conversion laminae with respect to their dimensions and edges essentially do not occur, or scarcely occur. Deviations due to production are not to be included in this.

In a refinement of the conversion lamina, the proportion of the conversion substance in the base material is between 55 wt % and 70 wt %. The conversion laminae are thus distinguished by a large content of the conversion substance, which makes it possible to operate a large number of color loci in conjunction with radiation-emitting semiconductor components.

In a refinement, the base material contains silicone. The conversion lamina is thus a silicone that contains conversion substance.

After their production, the conversion laminae produced by the method may be combined with radiation-emitting semiconductor components. In particular, such laminae may be applied directly onto radiation-emitting components.

In this case, for example, LEDs or thin-film LEDs which are suitable for emitting electromagnetic radiation may be envisioned as radiation-emitting components. By suitable combination of the produced conversion laminae with the radiation-emitting semiconductor components, it is thus possible to achieve devices which emit mixed radiation of a desired color locus.

Advantageous refinements of the conversion lamina are to be found in a similar way to the advantageous refinements of the production method, and vice versa.

BRIEF DESCRIPTION OF THE DRAWINGS

Other features, advantages, refinements and expediencies of the conversion lamina and its method may be found in the exemplary embodiments explained below in connection with FIGS. 1 to 4, in which.

Constituents which are the same or have the same effect are respectively provided with the same references. The constituents represented, and the size ratios of the constituents with respect to one another, are not to be regarded as true to scale.

DETAILED DESCRIPTION OF ILLUSTRATIVE EMBODIMENTS

Figure 1A:
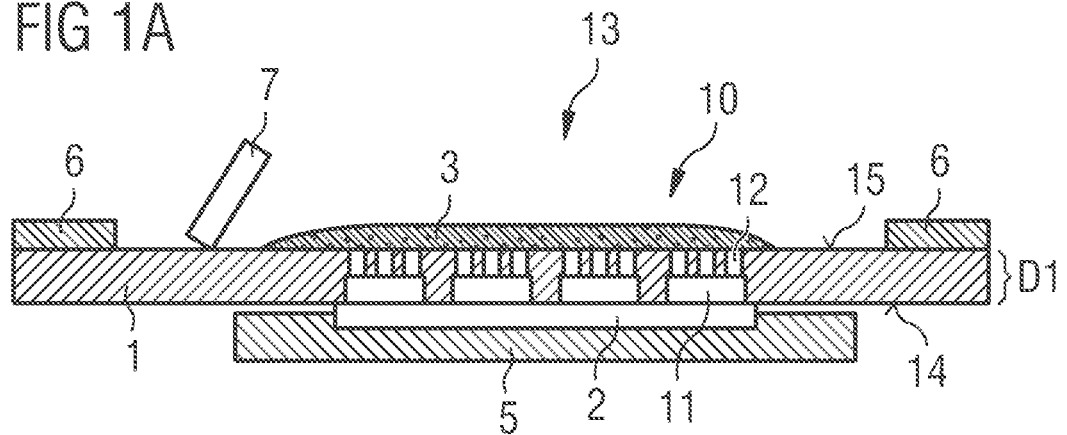
FIGS. 1A to 1C respectively show method steps for the production of a multiplicity of conversion laminae according to a first exemplary embodiment.
Figure 1B:
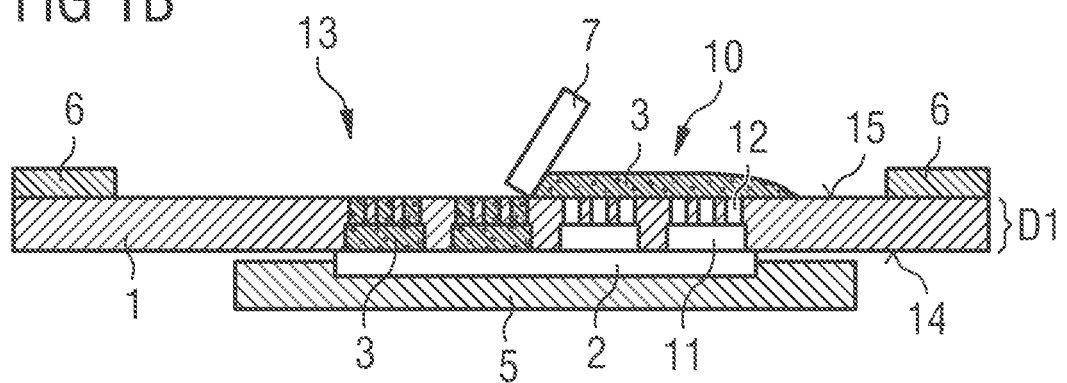
Figure 1C:
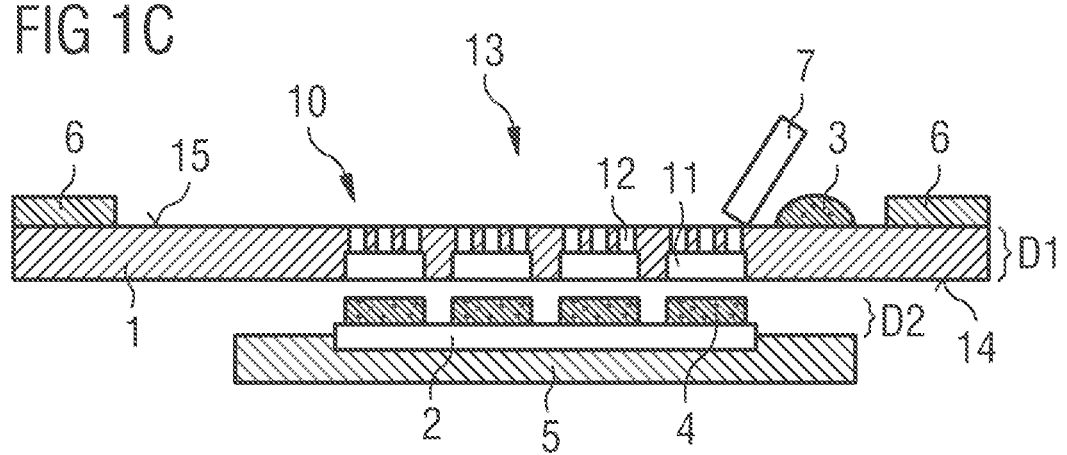

In FIGS. 1A to 1C, method steps for the production of a multiplicity of conversion laminae are shown. Conversion laminae produced in such a way are suitable in particular for use in combination with radiation-emitting semiconductor components, for example, LEDs. In this case, the conversion laminae are suitable for converting radiation emitted by the radiation-emitting semiconductor component at least partially into radiation of a another wavelength, so that a semiconductor component comprising a conversion lamina arranged thereon has mixed radiation consisting of emitted radiation and converted radiation. The conversion laminae produced are in this case arranged directly after a radiation exit side of the semiconductor component, for example, directly on a radiation exit surface.

In order to produce the conversion laminae, a template 1 is used in particular. The template 1 has a thickness $D_1$ in a range of between 80 μm and 150 μm, preferably between 100 μm and 110 μm. The template comprises openings 10 for forming the conversion laminae. The openings 10 in this case have two regions, a shaping region 11 and a grid structure 12. The regions of the openings 11 are in this case arranged above one another in the vertical direction, that is to say perpendicularly to the lateral extent of the template 1. The grid structure 12 and the shaping structure 11 of the openings 10 are formed in such a way that they merge into one another. This means that in particular no template material is arranged between the grid structure 12 and the shaping structure 11, so that the recesses of the grid structure 12 and the recesses of the shaping structure 11 merge into one another in such a way that the template is fully pierced in these regions.

In order to produce a multiplicity of conversion laminae, the template 1 comprises a multiplicity of openings 10, which are preferably formed identically or almost identically. In this case, the openings 10 are for example arranged in the manner of a matrix in the template. The openings 10 therefore respectively have a spacing from a neighboring opening in the lateral direction, the spacing being filled with template material.

The shaping structure 11 determines in particular the shape of the conversion laminae to be produced. The conversion laminae are therefore formed as a function of the configuration of the shaping structure 11. The size and configuration and the height of the conversion laminae are thus predetermined.

The grid structures 11 advantageously hold the template stably and advantageously precisely deliver the material of the conversion laminae to be produced to the shaping structure 11.

The double-layer template 1 is preferably produced by a two-stage lithographic and nickel electrolysis method and subsequently mounted in a clamping frame 6. The template 1 preferably consists of just one material, for example, nickel.

The template 1 has a printing side 15 and a bearing side 14. On the printing side 15, the template has a nickel fabric structure, so that planarity of the conversion laminae to be produced is ensured.

The template 1 is thus composed of two layers, the layer on the bearing side having a shaping structure and the layer on the printing side having a grid structure. The two layers of the template preferably consist of only one material, preferably nickel, so that the material of the conversion laminae to be produced can be optimized.

The double-layer template is in particular ideally suitable for applications in which high accuracy is important, and it advantageously offers a long lifetime.

With the bearing side 14, the template 1 is in direct contact with a substrate 2, as shown in FIG. 1A. The substrate is suitable in particular in that the conversion laminae can be arranged or produced thereon. The substrate 2 is arranged on a chuck, i.e., a clamping device.

The substrate 2 is in particular arranged below the openings 10, so that the conversion laminae produced by means of the openings 10 can be pressed onto the substrate.

A base material 3 comprising conversion substance contained therein is arranged on the printing side 15. The base material 3 is, for example, silicone, a conversion substance being embedded in the silicone. The base material 3 is in this case arranged on the printing side above the openings of the template, and preferably covers them fully.

In order then to press the base material 3 comprising conversion substance contained therein through the openings 10 of the template 1 by means of a printing process, a squeegee 7 is used. It is guided on the printing side 15 along the lateral extent of the template 1 over the printing side.

As represented in FIG. 1B, during the lateral guiding the squeegee 7 presses the base material 3 comprising conversion substance contained therein into the openings 10, in particular through the grid structure 12 into the shaping structure 11. In the exemplary embodiment of FIG. 1B, the base material 3 has already been pressed into two openings 10 of the template 1, while the base material 3 has not yet been pressed into the other two openings 10 by means of the squeegee 7.

During the printing process, the template 1 continues to lie in direct contact with the bearing side 14 on the substrate 2. The base material 3 is therefore pressed into the openings 10 during the printing process, in such a way that the base material preferably fully fills the shaping structure 11 of the template, the base material being pressed onto the substrate in regions of the shaping structures 11. The base material is in this case guided through the grid structure to the shaping structure of the template.

In FIG. 1C, the printing process by means of the squeegee 7 is concluded, that is to say the squeegee 1 has been guided from the left-hand side over the printing side 15 fully as far as the right-hand side of the template. The base material 3 has in this case been pressed into all openings 10 of the template 1. The remaining base material 3, i.e., the excess, is in this case collected at the end of the printing process by the squeegee 7, in the present exemplary embodiment on the right-hand side.

After the end of the printing process, the template 1 is removed from the substrate 2. The conversion laminae 4 produced in this way remain on the substrate 2. The shape, configuration and size of the conversion laminae 4 are in this case determined by the shaping structure 11 of the template 1.

By a production method with a double-layer template by means of a printing method, it is possible to produce conversion laminae which have a greater thickness $D_2$ than conversion laminae that are produced by conventional methods, for example screen printing technology. The layer thickness $D_2$ of the conversion laminae in this case preferably lies in a range of between 60 µm and 170 µm, preferably between 90 µm and 110 µm. The increased layer thickness $D_2$ of the conversion lamina can advantageously have a greater proportion of the conversion substance in the base material for the light conversion. In this way, it is advantageously possible to operate color loci which cannot be produced, for example, with the conventional production technology, for example, screen printing technology. Furthermore, an increased layer thickness of the conversion laminae 4 makes it possible to use conversion substances which are specially optimized in terms of their properties, for example, efficiency, thermal stability or long-term stability, and which are conventionally not employed, for example, owing to the limits of the solid loading in the base material, which are in turn dependent on the thickness of the conversion laminae 4.

The proportion of the conversion substance in the base material is preferably between 55 wt % and 70 wt %.

The double-layer template advantageously contributes to improvement of the edge accuracy and the reproducibility of the lamina dimensions. In particular, it is thus possible to produce conversion laminae 4 which are almost identical in terms of their dimensions and edge accuracy.

Owing to the nickel fabric structure of the template on the printing side 15, the surface of the conversion laminae 4 may for example have a mesh structure.

Figure 2A:
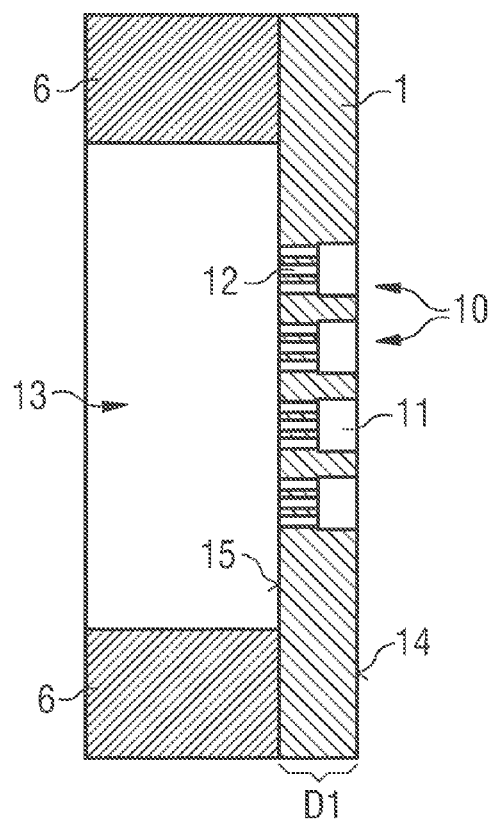
FIGS. 2A to 2C respectively show a schematic view of a template for the production of a multiplicity of conversion laminae according to a further exemplary embodiment.
Figure 2B:
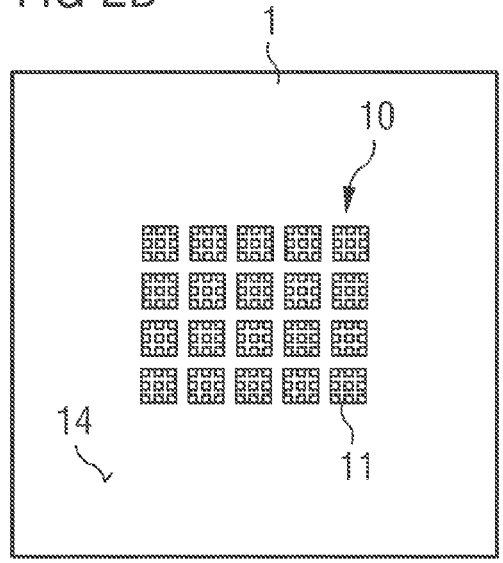
Figure 2C:
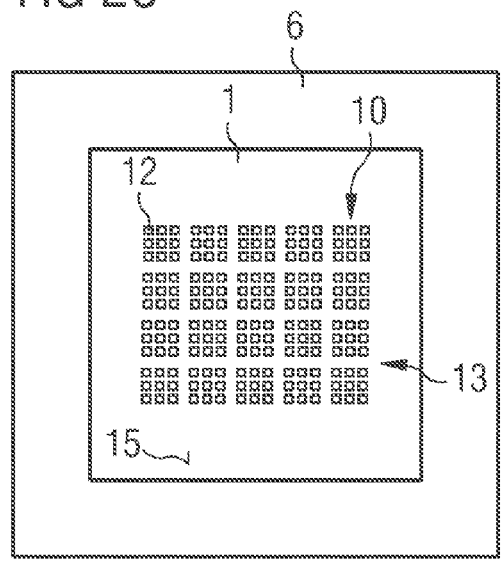

FIGS. 2A to 2C represent a double-layer template 1 which, for example, may be used in the method for producing a multiplicity of conversion laminae according to FIGS. 1A to 1C. The template 1 is produced in a two-stage method, so that it has a two-layer structure. The layer of the template 1 on a bearing side 14 has shaping structures 11. In the present exemplary embodiment, for example, these are formed as squares or rectangles. The second layer on the printing side 15 has a grid structure 12.

A grid structure is intended in particular to mean a structure which comprises openings arranged in the manner of a grid or a matrix through the template material.

The grid structure is in this case respectively assigned to a shaping structure. The shaping structure 11 and the grid structure 12 are formed in such a way that they merge into one another. The template is therefore partially fully pierced in the region of the openings 10. The template 1 in this case comprises a multiplicity of units consisting of the shaping structure 11 and the grid structure 12.

The template 1 is clamped by means of a clamping frame 6. The clamping frame 6 forms a recess 13 on the printing side 15, into which the base material comprising conversion substance contained therein is arranged for the production of the conversion laminae. The base material in this case fully covers the grid structures of the template 1.

FIG. 2B represents a plan view of the bearing side 15 of the template 1. The template 1 has a square shape in the present case and comprises openings 10 arranged in the manner of a matrix. An opening 10 is respectively composed of a shaping structure 11 and grid structures arranged above. Of the bearing side, the shaping structures 11 can be seen in particular, the grid structures being visible through the shaping structures. The bearing side 14 of the template 1 preferably has a planar shape, and thus has a planar surface with which the template 1 is arranged on the substrate.

FIG. 2C shows a plan view of the printing side 15 of the template 1. The template 1 is stabilized in particular by means of a clamping frame 6 arranged in the manner of a frame. The clamping frame 6 is in this case arranged in the edge region of the template 1 in such a way that a recess 13 is formed in a central region of the template, particularly in the region in which the openings 10 are arranged. The grid structures 12, which are arranged in the manner of a matrix above the shaping structures, can be seen on the printing side. Each grid structure is in this case composed of a multiplicity of openings, which are arranged in the manner of a grid, an opening of the grid structure respectively having a smaller lateral extent than the shaping structure, so that a multiplicity of openings, arranged in the manner of a matrix, of the grid structure are arranged over each shaping structure. In order to produce the conversion laminae, the base material comprising conversion substance contained therein is arranged into the recess 13 and pressed into the openings by means of a squeegee.

Figure 3A:
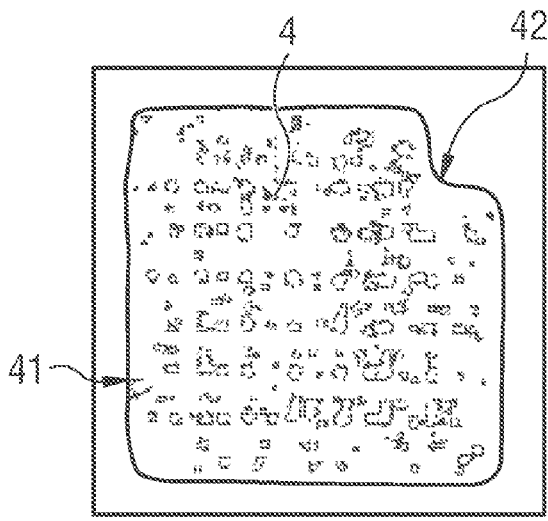
FIGS. 3A and 3B respectively show a plan view of a conversion lamina produced by the method according to the invention (FIG. 3A) and according to the prior art (FIG. 3B)
Figure 3B:
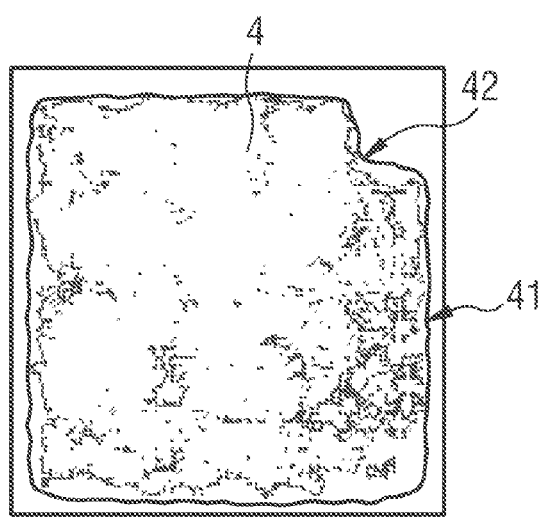

FIGS. 3A and 3B represent a comparison of a conversion lamina which is produced by means of a method according to the invention, see FIG. 3A, or by means of a conventionally used screen printing method, see FIG. 3B. In particular, a plan view of a conversion lamina 4 is respectively shown.

As represented in FIG. 3A, a conversion lamina 4 printed by means of a double-layer template has a sharp-edged contour. The edges 41 are thus imaged sharply. In comparison thereto, a conversion lamina 4 produced according to the prior art has disadvantageously wavy edges 41.

The conversion laminae 4 of FIGS. 3A and 3B respectively have a recess 42, these being arranged in an intended bonding pad region of a radiation-emitting semiconductor component.

Figure 4A:
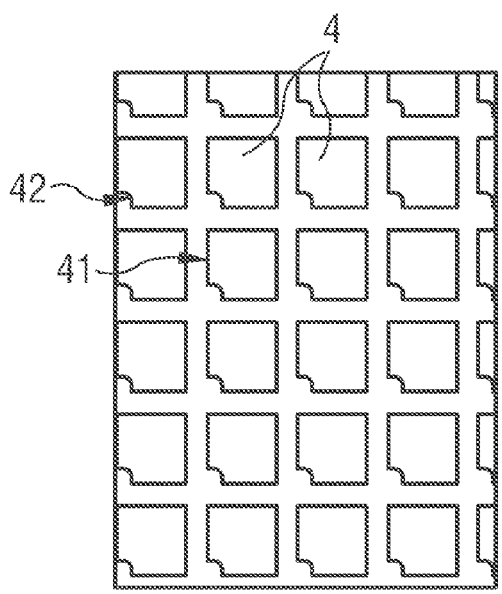
FIGS. 4A and 4B respectively show a plan view of a multiplicity of conversion laminae produced by the method according to the invention (FIG. 3A) and according to the prior art (FIG. 3B).
Figure 4B:
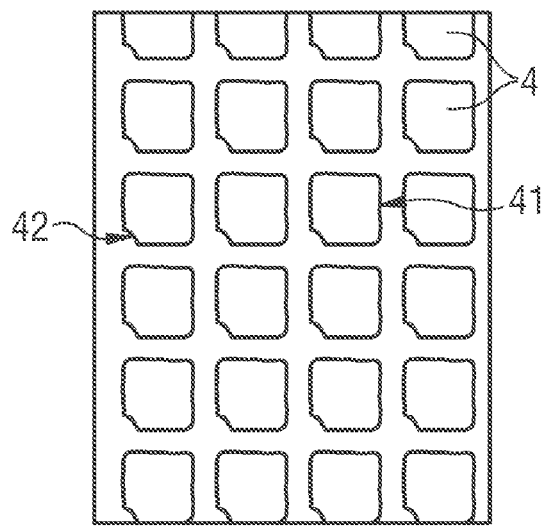

FIGS. 4A and 4B respectively show a multiplicity of conversion laminae 4, which are produced on the one hand by the method according to the invention and on the other hand according to the prior art. As represented in FIG. 4A, the bonding pad regions of the conversion laminae 4 printed with the double-layer template are each shaped very similarly, and formed almost identically. In particular, the shape, configuration, size and edges of the conversion laminae 4 scarcely have any deviations from one another. In contrast thereto, the shape of the bonding pad regions of the screen-printed conversion laminae 4 and the shape, configuration, size and edges thereof are configured very differently, as represented in FIG. 4B. The different formation is due in particular to the masking of the screen.

The invention is not restricted by the description with the aid of the exemplary embodiments to these exemplary embodiments, but covers any new feature and any combination of features, which includes in particular any combination of features in the patent claims, even if these features or these combinations are not explicitly indicated per se in the claims or exemplary embodiments.

The invention claimed is:

1. A method for producing at least one conversion lamina for a radiation-emitting semiconductor component, the method comprising:
   applying a base material comprising a conversion substance contained therein onto a substrate using a double-layer template,
   wherein the base material contains silicone;
   wherein the substrate is a film substrate which is arranged on a clamping device,
   wherein the template comprises two regions, which are arranged vertically above one another, a shaping region facing toward the substrate replicating a shape of the conversion lamina to be produced and a region facing away from the substrate having a grid structure for stabilization of the template;
   wherein each grid structure is composed of a plurality of openings arranged as a grid, each opening of the grid structure having a smaller lateral extent than the shaping region, so that a plurality of the openings, arranged in the manner of a matrix, of the grid structure are arranged over each shaping region;

wherein the template consists substantially of nickel; and wherein the shaping region is formed such that a produced conversion lamina has a recess arranged in an intended bonding pad region of a radiation-emitting semiconductor component.

2. The method according to claim 1, wherein the base material comprising conversion substance contained therein is applied by a printing method.

3. The method according to claim 1, wherein the template comprises at least one opening, through which the base material comprising the conversion substance contained therein is pressed onto the substrate.

4. The method according to claim 3, wherein the template comprises a printing side and a bearing side.

5. The method according to claim 4, wherein the base material comprising the conversion substance contained therein is applied onto the printing side and subsequently pressed onto the substrate through the template with a squeegee.

6. The method according to claim 1, wherein the template is arranged in direct contact with the substrate when the base material is being applied.

7. The method according to claim 1, wherein the conversion lamina is produced with a thickness of between 60 µm inclusive and 170 µm inclusive.

8. The method according to claim 1, wherein a plurality of conversion laminae are produced in a combined method, these laminae being applied onto the substrate in a combined method step by a printing method.

9. The method according to claim 8, wherein the template comprises a plurality of openings, by which the shape of a conversion lamina is respectively determined.

10. The method according to claim 1, wherein the substrate and the conversion lamina are free from a radiation-emitting semiconductor component.

11. A method for producing at least one conversion lamina for a radiation-emitting semiconductor component, the method comprising:

applying a base material comprising a conversion substance contained therein onto a substrate using a double-layer template;

wherein the template comprises two regions, which are arranged vertically above one another, a shaping region facing toward the substrate replicating a shape of the conversion lamina to be produced and a region facing away from the substrate having a grid structure for stabilization of the template;

wherein each grid structure is composed of a plurality of openings arranged as a grid, each opening of the grid structure having a smaller lateral extent than the shaping region, so that a plurality of the openings, arranged in the manner of a matrix, of the grid structure are arranged over each shaping region; and wherein the shaping region is formed such that a produced conversion lamina has a recess arranged in an intended bonding pad region of a radiation-emitting semiconductor component.

12. The method according to claim 11, wherein the template consists of only one material.

13. The method according to claim 12, wherein the template consists of nickel.

* * * * *